United States Patent
Okushima

(10) Patent No.: US 6,346,471 B1
(45) Date of Patent: Feb. 12, 2002

(54) MULTILAYER WIRING STRUCTURE AND SEMICONDUCTOR DEVICE HAVING THE SAME, AND MANUFACTURING METHOD THEREFOR

(75) Inventor: Mototsugu Okushima, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/637,255

(22) Filed: Aug. 11, 2000

Related U.S. Application Data

(62) Division of application No. 09/315,825, filed on May 21, 1999, now Pat. No. 6,163,075.

(30) Foreign Application Priority Data

May 26, 1998 (JP) .......................................... 10-144715

(51) Int. Cl.[7] .......................................... H01L 21/4763
(52) U.S. Cl. ....................................... 438/622; 435/623
(58) Field of Search ................................ 438/622, 623, 438/631, 637, 638, 639, 640, 625, 644, 645, 692, 695, 697

(56) References Cited

U.S. PATENT DOCUMENTS

| | | | |
|---|---|---|---|
| 5,036,383 A | * 7/1991 | Mori | ........................... 357/71 |
| 5,060,051 A | 10/1991 | Usuda | |
| 5,442,239 A | 8/1995 | DiGiacomo et al. | |
| 5,567,981 A | 10/1996 | Bhansali et al. | |
| 5,739,587 A | 4/1998 | Sato | |
| 5,886,410 A | 3/1999 | Chiang et al. | |
| 5,923,088 A | 7/1999 | Shiue et al. | |
| 6,163,075 A | * 12/2000 | Okushima | ................... 257/759 |

FOREIGN PATENT DOCUMENTS

| | | |
|---|---|---|
| JP | 62-102543 | 5/1987 |
| JP | 63-308924 | 12/1988 |
| JP | 02-231735 | 9/1990 |
| JP | 4-253337 | 9/1992 |
| JP | 05-183007 | 7/1993 |
| JP | 05-234998 | 9/1993 |

* cited by examiner

*Primary Examiner*—David Nelms
*Assistant Examiner*—David Nhu
(74) *Attorney, Agent, or Firm*—Sughrue Mion, PLLC

(57) ABSTRACT

In a multilayer wiring structure, a plurality of wiring layers (9, 11, 13) are formed on an inorganic lowermost insulating film (2) formed on a silicon substrate (1), and organic interlayer insulating films (14, 15, 16, 17, 18) are interposed between the respective adjacent wiring layers. Via metal (8, 10, 12) are formed in the inorganic lowermost insulating film (2) and the organic interlayer insulating films (15, 17), and openings having the shape corresponding to an electrode pad are formed in the organic interlayer insulating films (14, 15, 16, 17, 18), and these openings are filled with metal material to form metal film patterns (3, 4, 6, 5, 7), whereby the electrode pad is constructed as the laminate body of the metal film patterns (3, 4, 6, 5, 7). Accordingly, even when organic material having a low dielectric constant is used for the interlayer insulating films, durability of an electrode portion to impacts in a bonding process is enhanced, and both of reduction in parasitic capacitance and enhancement in strength of the electrode portion can be achieved.

11 Claims, 15 Drawing Sheets

F I G. 11
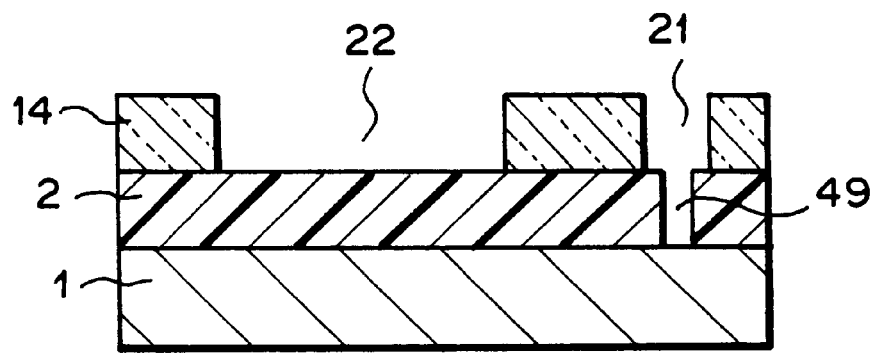
F I G. 12
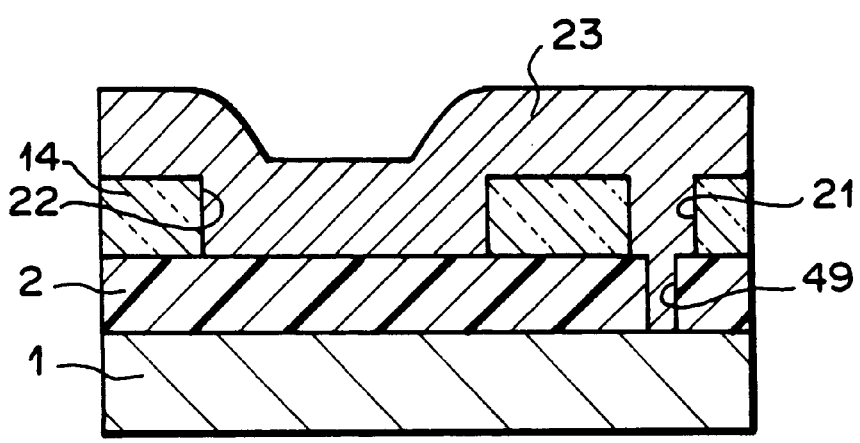
F I G. 13
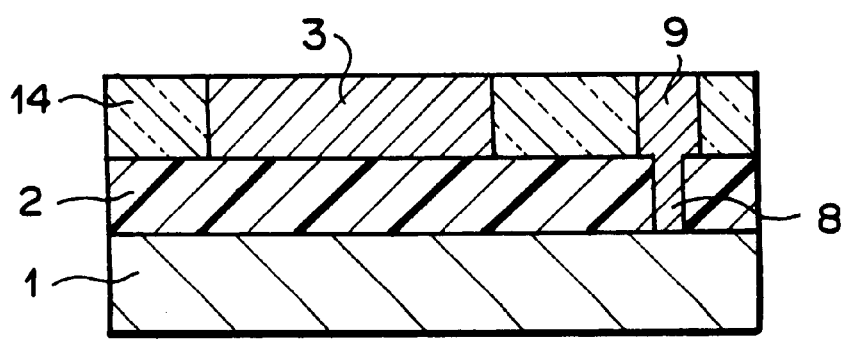

F I G. 14
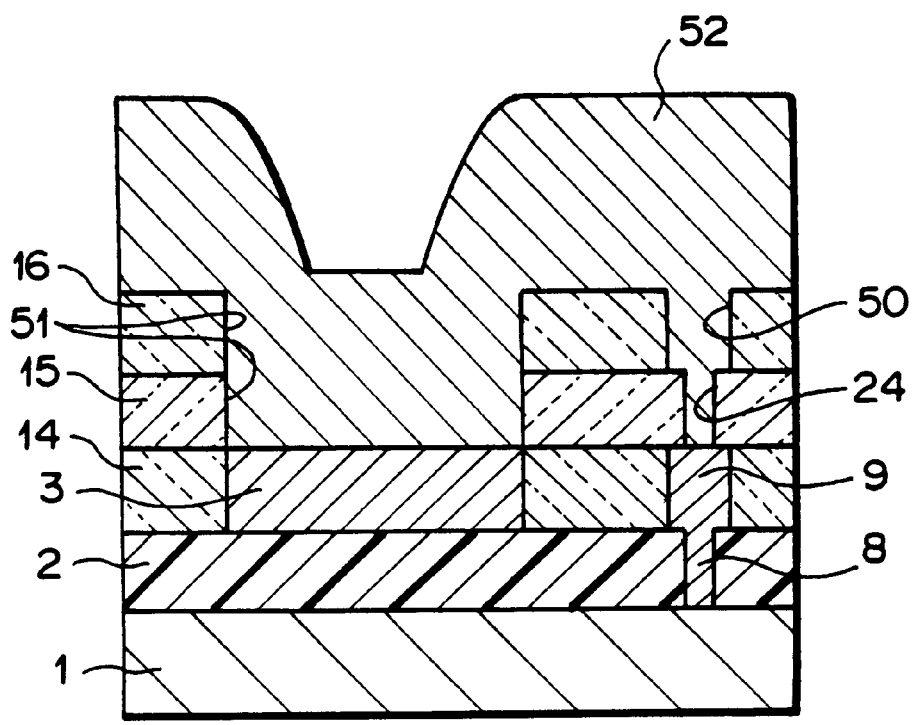
F I G. 15
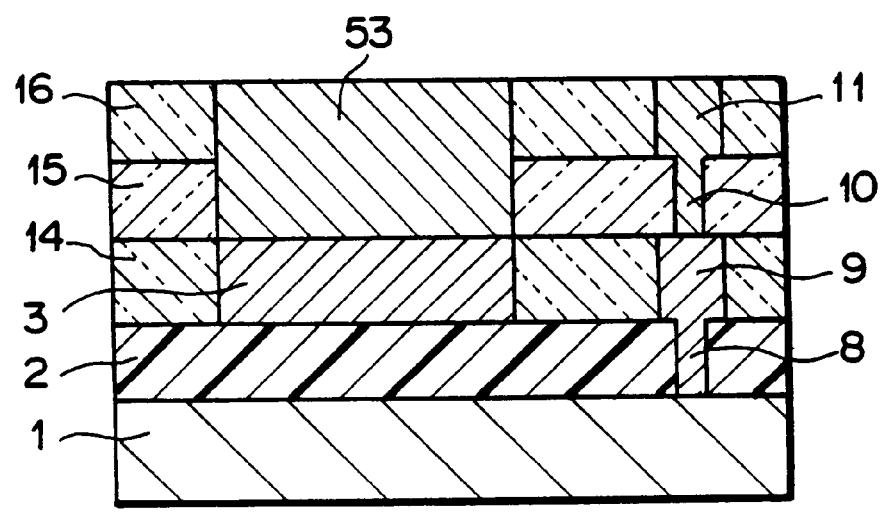

F I G. 18
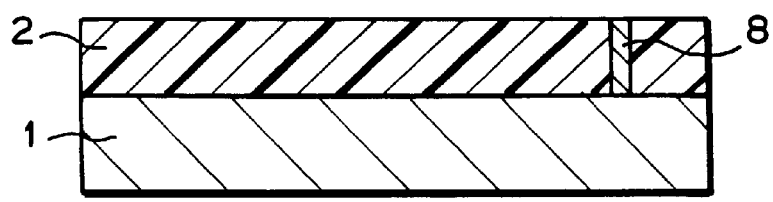
F I G. 19
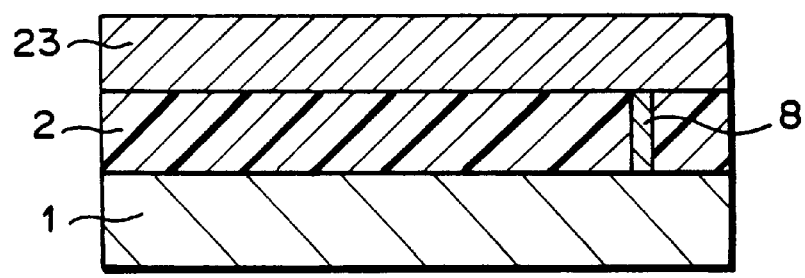
F I G. 20
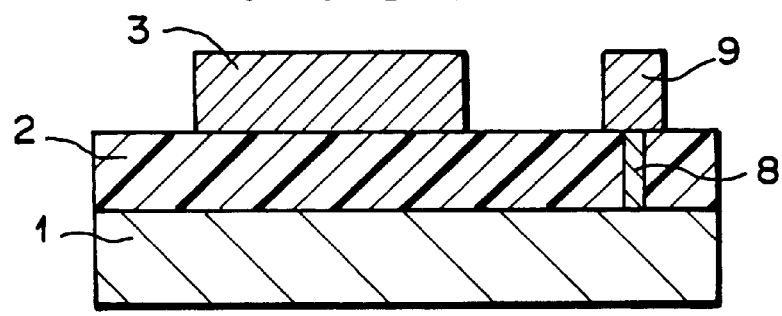
F I G. 21
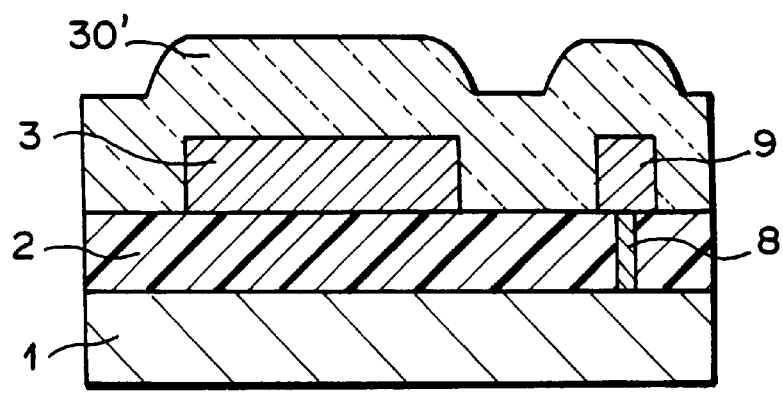

MULTILAYER WIRING STRUCTURE AND SEMICONDUCTOR DEVICE HAVING THE SAME, AND MANUFACTURING METHOD THEREFOR

This is a divisional of application Ser. No. 09/315,825 filed May 21, 1999, U.S. Pat. No. 6,163,075 the disclosure of which is incorporated herein by reference.

BACKGROUND OF THE INVENTION

1. Field of the Invention

The present invention relates to a multilayer wiring technique, and particularly to a multilayer wiring structure which is characterized in the structure of an electrode portion, and a method of manufacturing the same. The multilayer wiring structure of the present invention is applicable to wirings in a semiconductor device, for example.

2. Description of the Related Art

With respect to a semiconductor device, a multilayer wiring structure is formed on the surface of a semiconductor substrate in order to establish the wiring between various types of functional elements constituting the semiconductor device. In the multilayer wiring structure, a plurality of wiring layers are provided through interlayer insulating films, and the wirings of the respective wiring layers are conducted to one another at suitable positions by conductive members (via metal) filled in via holes which are respectively formed in the insulating films.

Recently, higher density wiring has been gradually required, and this requirement has caused increasing tendencies of reducing the thickness of the interlayer insulating films constituting such a multilayer wiring structure as described above. When the thickness of the interlayer insulating film is reduced, parasitic capacity trends to increase. Therefore, material having dielectric constant which is as low as possible is preferably used for the interlayer insulating film. As the interlayer insulating film having a low dielectric constant may be used organic materials such as hydrogen silsesquioxane (HSQ), fluorinated carbon (a-C:F), benzocyclobutene (BCB) or the like. However, the organic interlayer insulating film is generally lower in strength and adhesiveness or adhesion than the inorganic interlayer insulating film made of silicon oxide or silicon nitride for example.

The multilayer wiring structure is provided with an electrode pad serving as an electrode portion for establishing electrical connection with an external circuit, and the electrode pad is generally formed on the uppermost wiring layer. The connection between the electrode pad and the external circuit is performed by wire bonding. In the wire boding process, press force based on ultrasonic vibration to contact the bonding wire to the electrode pad by a bonding head and tensile force at the retraction time of the bonding head are applied to the electrode pad.

Accordingly, in the multilayer wiring structure using organic layer insulating films which are low in strength and adhesiveness, there is a risk that exfoliation occurs between the insulating films, cracks occur in the insulating films or an metal film of the electrode pad is exfoliated from the organic interlayer insulating film through the wire bonding process.

FIGS. 27 to 30 show a method of manufacturing a conventional multilayer wiring structure.

First, as shown in FIG. 27, a first interlayer insulating film 30 is formed on a semiconductor substrate 1 in which various functional elements such as transistors, diodes, capacitors, etc. are formed, and a metal film is formed on the first interlayer insulating film 30 and then subjected to a patterning treatment by using an etching technique to form a metal film pattern 33. As not shown, a wiring of a wiring layer containing the metal film pattern 33 is electrically connected to each of the functional elements of the semiconductor substrate 1 through via metal filled in a via hole which is formed at a suitable position in the first interlayer insulating film 30.

Subsequently, as shown in FIG. 28, an interlayer insulating film is formed on the resultant body of FIG. 27 and then a hole which is slightly smaller than the size of the metal film pattern 33 is formed in the interlayer insulating film, whereby the electrode pad 33 is fixed by second interlayer insulating films 31a, 31b.

Subsequently, as shown in FIG. 29, a metal film is formed on the resultant body of FIG. 28 and then subjected to a patterning treatment by using the etching technique to form a metal film pattern 34. The metal films of the metal film pattern 33 and the metal film pattern 34 are brought into close contact with each other. As not shown, the wirings of the wiring layer containing the metal film pattern 34 are connected to the wirings of the wiring layer containing the metal film pattern 33 through via metal filled in via holes which are formed at suitable positions in the second interlayer insulating films 31a, 31b as occasion demands.

Subsequently, as shown in FIG. 30, an insulating film is formed on the resultant body of FIG. 29 and a hole which is slightly smaller than the size of the metal film pattern 34 is formed, whereby the metal film pattern 34 is fixed by upper insulating films 31a, 31b. Thereafter, a wire 20 is bonded to the metal film pattern 34. The electrode pad is constructed by the metal film patterns 33, 34.

In the multilayer wiring structure thus obtained, the second interlayer insulating films 31a, 31b cover the peripheral portion of the metal film pattern 33, and likewise the upper layer insulating films 31a, 31b cover the peripheral portion of the metal film pattern 34. Accordingly, according to this structure, when organic insulating films having low dielectric constant are used for the second interlayer insulating films 31a, 31b and the upper layer insulating films 32a, 32b, the organic films which are low in film strength and also low in adhesiveness to metal films cover the peripheral portion of the electrode pad, so that cracks are liable to occur in the organic layer insulating films. Further, this structure is not suitable to a multilayer wiring structure having a number of layers because the interlayer insulating films are not flattened.

FIGS. 31 to 37 show another method of manufacturing a conventional multilayer wiring structure.

First, as shown in FIG. 31, a first interlayer insulating film 41 is formed on a semiconductor substrate 1 in which various functional elements such as transistors, diodes, capacitors, etc. are formed, and then first-layer via metal 8 is filled into a via hole formed in the insulating film 41. Further, a metal film is formed on the interlayer insulating film 41 and then subjected to a patterning treatment by using the etching technique to form a first-layer wire 9. The first-layer wire 9 is electrically connected to each of the functional elements of the semiconductor substrate 1 through the first-layer via metal 8. Further, an interlayer insulating film is formed thereon, and flattened to form a second layer insulating film 42. Second-layer via metal 10 is filled into a via hole formed in the second interlayer insulating film 42, and a metal film 46 is formed thereon.

Subsequently, as shown in FIG. 32, the metal film 46 is subjected to a patterning treatment by using the etching technique to form a second-layer wiring 11. At this time, the metal film pattern 5 is formed at the position where the electrode pad will be formed.

Subsequently, as shown in FIG. 33, an interlayer insulating film 43' is formed thereon.

Subsequently, as shown in FIG. 34, the interlayer insulating film 43' is subjected to a chemical/mechanical polishing treatment (CMP) to be flattened, thereby obtaining a third interlayer insulating film 43.

Subsequently, as shown in FIG. 35, a via hole is formed in the third interlayer insulating film 43, and a metal film 47 is deposited thereon, whereby a metal film 48c is filled into the via hole formed at the positions corresponding to the second-layer wiring 11, and also metal films 48a, 48b are filled into via holes formed at the positions corresponding to the metal film pattern 5.

Subsequently, as shown in FIG. 36, the upper surface portion of the metal film 47 is removed by an etch back method, whereby third-layer via metal 12 connected to the second-layer wirings 11 is formed and also via metal 45a, 45b connected to the metal film pattern 5 are formed. Since the upper surface portion of the metal film 47 is removed and flattened by the etch back method to form via metal 45a, 45b as described above, the area of each of the via holes to be filled with the metal films 48a, 48b cannot be increased to the same level as the metal film pattern 5. This is because if the area of the via hole is increased, it is difficult to perfectly fill the metal film 47 into the via hole while flattening the surface of the metal film 47 in the via hole by the etch back method.

Subsequently, as shown in FIG. 37, a metal film is formed and then subjected to the patterning treatment by the etching technique to form a third-layer wiring 13. At this time, a metal film pattern 7 is formed at the position corresponding to the metal film pattern 5. The metal film pattern 7 is connected to the metal film pattern 5 through the via metal 45a, 45b. Further, an interlayer insulating film is formed thereon and then flattened by CMP to form an upper-layer insulting film 44. Subsequently, a passivation film 19 having an opening at the portion corresponding to the electrode pad 7 is formed, and then a wire 20 is bonded to the metal film pattern 7. The electrode pad is constructed by the metal film pattern 7.

In the multilayer wiring structure thus obtained, since the process of etching back the metal film 47 when the via metal 12 is formed as described above, it is difficult to simultaneously flatten the minute via metal 12 and the metal film pattern in the via hole having the area as large as the electrode pad. Therefore, the metal film pattern 5 having the area as large as the electrode pad 7 is formed at the time when the second-layer wiring 11 is formed, and then the electrode pad 7 is formed at the time when the third-layer wiring 13 is formed. The electrode pad 7 and the meal film pattern 5 are connected to each other by the via metal 45a, 45b to enhance the strength to impacts in the wire bonding process.

In this structure, however, when an organic insulating film having low film strength is used as the interlayer insulating film, stress is concentrated to the interlayer insulating film portion sandwiched between the metal film pattern 5 and the metal film pattern (electrode pad) 7, and cracks may occur at this portion with high probability. Therefore, this structure is not sufficient.

SUMMARY OF THE INVENTION

The present invention has been implemented in view of the foregoing problem of the prior art, and has an object to provide a multilayer wiring structure having an electrode portion structure which is enhanced in durability to impacts such as press force, tensile force, etc. in a bonding process such as wire boding or the like.

Particularly, the present invention has another object to provide a multilayer wiring structure which can reduce parasitic capacitance and enhance the strength of an electrode portion with high durability to impacts in a bonding process even when an interlayer insulating film of organic material having a low dielectric constant is used.

Further, the present invention has further object to provide a semiconductor device having the multilayer wiring structure described above.

In order to attain the above objects, according to a first aspect of the present invention, there is provided a multilayer wiring structure including: a plurality of wiring layers formed on a substrate through a lowermost insulating film; interlayer insulating films formed so that the adjacent wiring layers are insulated from each other by each of the interlayer insulating films; and an electrode pad which is connected to a wiring of at least one of the plurality of wiring layers for electrical connection with the external, wherein the electrode pad is composed of a conductive member formed so as to penetrate through the interlayer insulating films in the film thickness direction, the side surface of the conductive member extending in the film thickness direction, and the lowermost insulating film is formed of an inorganic insulating film.

In the above multilayer wiring structure, the interlayer insulating film may be composed of an organic insulating film.

In the above multilayer wiring structure, the electrode pad may be composed of a laminate body of conductive films having the same shape.

In the above multilayer wiring structure, a conductive path for connecting the wirings of two adjacent wiring layers to each other may be formed in each of the interlayer insulating films.

In the above multilayer wiring structure, the diameter of the conductive path may be set to be smaller than the diameter of the electrode pad.

In the above multilayer wiring structure, the substrate may be a semiconductor substrate.

In order to attain the above objects, according to a second aspect of the present invention, there is provided a semiconductor device having the above multilayer wiring structure, wherein a functional element is formed in the semiconductor substrate and at least one wiring of at least one of the plurality of wiring layers may be connected to the functional element through a conductive path which extends through the lowermost insulating film.

In order to attain the above objects, according to a third aspect of the present invention, a method of manufacturing the above multilayer wiring structure is characterized in that when a plurality of wiring layers are formed on the lowermost insulating film formed on a substrate so that an interlayer insulating film is interposed between respective adjacent wiring layers of the plurality of wiring layers so as to insulate the respective adjacent wiring layers from each other, (a) a film forming step of forming an opening having the shape corresponding to the electrode pad in the interlayer insulating film and filling conductive material into the opening to form a conductive film pattern, or (b) a film forming step of forming a conductive film pattern having the shape corresponding to the electrode pad and filling the interlayer insulating film in a portion around the conductive film pattern, is carried out at plural times to form conductive film patterns of plural layers, the electrode pad is formed as a laminate body of the conductive film patterns of the plural layers, and the formation of the respective wiring layers is performed simultaneously with the formation of any one of the conductive film patterns of the plural layers.

In the above manufacturing method, in any one of the film forming steps (a) and (b), interlayer insulating films of two layers may be formed, and the wiring layer may be formed in any one of the two layers simultaneously with the formation of the conductive film pattern.

In the above manufacturing method, in any one of the film forming steps (a) and (b), two layers of conductive film patterns may be formed, and the wiring layer may be formed simultaneously with the formation of one of the conductive film patterns.

In the above manufacturing method, when the conductive film patterns are formed, the surfaces of the conductive film patterns may be flattened by using a chemical/mechanical polishing treatment.

In the above manufacturing method, when the interlayer insulating films are formed, the surfaces of the interlayer insulating films may be flattened by using a chemical/mechanical polishing treatment.

In the above manufacturing method, when the opening is formed in at least one of the interlayer insulating films, a via hole may be formed, and when the conductive film patterns are formed, the via hole may be filled with conductive material, thereby forming a conductive path through which the wirings of the two wiring layers adjacent to the interlayer insulating film concerned are connected to each other.

In order to attain the above objects, according to a fourth aspect of the present invention, a method of manufacturing the semiconductor device is characterized in that when a lowermost insulating film is formed on a semiconductor substrate in which functional elements are formed, and a plurality of wiring layers are formed on the lowermost insulating film so that an interlayer insulating film is interposed between respective adjacent wiring layers so as to insulate the wiring layers from each other, (a) a film forming step of forming an opening having the shape corresponding to the electrode pad in the interlayer insulating film and filling conductive material into the opening to form a conductive film pattern, or (b) a film forming step of forming a conductive film pattern having the shape corresponding to the electrode pad and filling the interlayer insulating film in the peripheral portion of the conductive film pattern, is carried out at plural times to form conductive film patterns of plural layers; the electrode pad is formed as a laminate body of the conductive film patterns of the plural layers; the formation of the respective wiring layers is performed simultaneously with the formation of any one of the conductive film patterns of the plural layers; in order to form a conductive path through which a wiring of at least one of the plurality of wiring layers and at least one of the functional elements are connected to each other, a first conductive film is formed in via holes formed in the interlayer insulating films below the wiring layer concerned simultaneously with the formation of the conductive film pattern, and a second conductive film is formed in a via hole formed in the lowermost insulating film, whereby the conductive path is formed through the first and second conductive films and the wirings of the wiring layers below the wiring layer concerned.

In the above manufacturing method, in any one of the film forming steps (a) and (b), interlayer insulating films of two layers may be formed, and the wiring layer may be formed in any one of the two layers simultaneously with the formation of the conductive film pattern.

In the above manufacturing method, in any one of the film forming steps (a) and (b), two layers of conductive film patterns may be formed, and the wiring layer may be formed simultaneously with the formation of one of the conductive film patterns.

In the above manufacturing method, when the conductive film patterns are formed, the surfaces of the conductive film patterns may be flattened by using a chemical/mechanical polishing treatment.

In the above manufacturing method, when the interlayer insulating films are formed, the surfaces of the interlayer insulating films may be flattened by using a chemical/mechanical polishing treatment.

According to the present invention, no organic interlayer insulating film exists below the electrode pad, and thus the impacts in the bonding step are applied to only the metal film pattern and the inorganic insulating film which are high in film strength and adhesiveness. Therefore, the occurrence of cracks in the organic interlayer insulating films and the exfoliation of the electrode pad can be prevented, and thus there can be provided a multilayer wiring structure having an electrode portion structure which is enhanced in durability, and a semiconductor device having such a multilayer wiring structure.

BRIEF DESCRIPTION OF THE DRAWINGS

FIG. 11 is a cross-sectional view showing a manufacturing step of a second embodiment of the manufacturing method of the semiconductor device having the multilayer wiring structure according to the present invention;

FIG. 12 is a cross-sectional view showing another manufacturing step of the second embodiment of the manufacturing method of the semiconductor device having the multilayer wiring structure according to the present invention;

FIG. 13 is a cross-sectional view showing another manufacturing step of the second embodiment of the manufacturing method of the semiconductor device having the multilayer wiring structure according to the present invention;

FIG. 14 is a cross-sectional view showing another manufacturing step of the second embodiment of the manufacturing method of the semiconductor device having the multilayer wiring structure according to the present invention;

FIG. 15 is a cross-sectional view showing another manufacturing step of the second embodiment of the manufacturing method of the semiconductor device having the multilayer wiring structure according to the present invention;

FIG. 18 is a cross-sectional view showing a manufacturing step of a third embodiment of the manufacturing method of the semiconductor device having the multilayer wiring structure according to the present invention;

FIG. 19 is a cross-sectional view showing another manufacturing step of third embodiment of the manufacturing method of the semiconductor device having the multilayer wiring structure according to the present invention;

FIG. 20 is a cross-sectional view showing another manufacturing step of third embodiment of the manufacturing method of the semiconductor device having the multilayer wiring structure according to the present invention;

FIG. 21 is a cross-sectional view showing another manufacturing step of third embodiment of the manufacturing method of the semiconductor device having the multilayer wiring structure according to the present invention;

DETAILED DESCRIPTION OF THE PREFERRED EMBODIMENTS

Preferred embodiments according to the present invention will be described hereunder with reference to the accompanying drawings.

FIGS. 1 to 10 are cross-sectional views showing a series of a manufacturing process of a first embodiment of a method of manufacturing a semiconductor device having a multilayer wiring structure according to the present invention.

Figure 1:
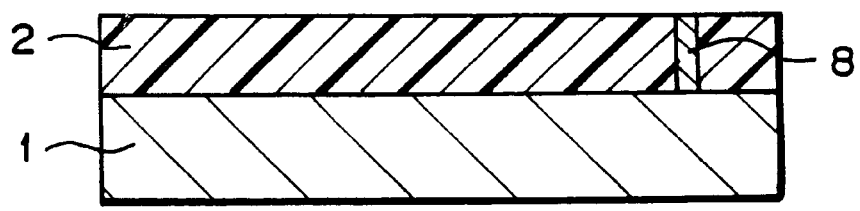
FIG. 1 is a cross-sectional view showing a manufacturing step of a first embodiment of a manufacturing method of a semiconductor device having a multilayer wiring structure according to the present invention.

First, as shown in FIG. 1, a lowermost insulating film 2 is formed at a thickness of about 0.3 to 1.0 $\mu$m on a silicon substrate 1 in which various functional elements such as transistors, diodes, capacitors, etc. are formed. The lowermost insulating film 2 is formed of an inorganic insulating film such as a silicon oxide film, a silicon nitride film or the like. The inorganic insulating film has high adhesiveness to the silicon substrate 1, and also has high adhesiveness to the metal film constituting the electrode pad which will be formed later. Further, via metal 8 is filled into a via hole having a diameter of about 0.1 to 1.0 $\mu$m formed through the lowermost insulating film 2.

Figure 2:
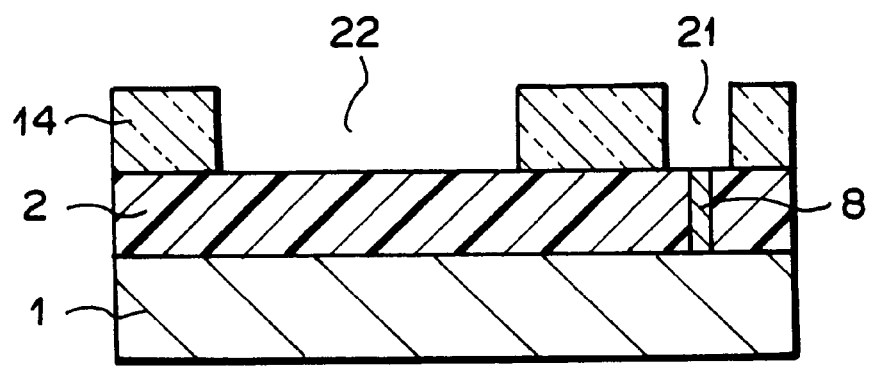
FIG. 2 is a cross-sectional view showing another manufacturing step of the first embodiment of the manufacturing method of the semiconductor device having the multilayer wiring structure according to the present invention.

Subsequently, as shown in FIG. 2, a first interlayer insulating film 14 of organic material having a low dielectric constant such as hydrogen silsesquioxane (HSQ), fluorinated carbon (a-C:F) or benzocyclobutene (BCB) is formed at a thickness of about 0.3 to 1.0 µm on the lowermost insulating film 2. The first interlayer insulating film 14 thus formed is subjected to a patterning treatment by using a dry etching technique to form a groove 21 (having the plan view shape corresponding to the shape of the wiring pattern) for a first layer wiring. At this time, a groove 22 (having the plan view shape corresponding to an electrode pad) is formed at the position where the electrode pad will be formed later. The formation of these grooves is performed so that the organic interlayer insulating film (first interlayer insulating film 14) does not remain on the bottom surfaces of the grooves, and the inorganic interlayer insulating film (lowermost insulating film 2) is wholly exposed to the outside at the bottoms of the grooves. The width (wiring width) of the groove 21 is set to the same level as or larger than the diameter (about 0.1 to 1.0 µm) of the via hole formed in the lowermost insulating film 2 for example. The width of the groove 22 (the dimension of the plan view shape of the electrode pad) is set to about 80 to 100 µm square for example.

Figure 3:
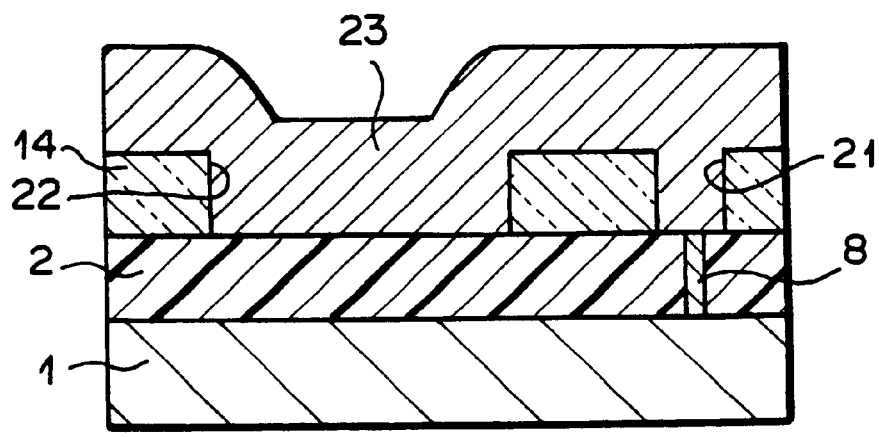
FIG. 3 is a cross-sectional view showing another manufacturing step of the first embodiment of the manufacturing method of the semiconductor device having the multilayer wiring structure according to the present invention.

Subsequently, as shown in FIG. 3, a metal film 23 of a conductive wiring material such as copper, aluminum or the like is formed on the intermediate structure of FIG. 2 to fill the metal film 23 into the first-layer wiring groove 21 and the electrode-pad forming groove 22.

Figure 4:
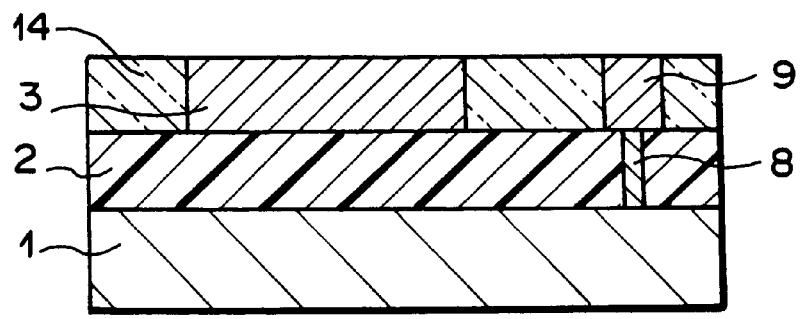
FIG. 4 is a cross-sectional view showing another manufacturing step of the first embodiment of the manufacturing method of the semiconductor device having the multilayer wiring structure according to the present invention.

Subsequently, as shown in FIG. 4, the metal film 23 is polished and flattened by using a metal CMP (chemical/mechanical polishing to metal) technique to form the first-layer wiring 9 and a metal film pattern 3 of a conductive film which serves as a part of the electrode pad. The first-layer wiring 9 is electrically connected to each functional element in the silicon substrate 1 through the via metal 8. Through the above process, the bottom surface of the metal film pattern 3 comes into contact with the inorganic lowermost insulating film 2 having high film strength, and no organic interlayer insulating film exists beneath the metal film pattern 3.

It is difficult to flatten both of the metal film in the minute wiring groove or via hole and the metal film in the electrode pad forming groove having a larger area than the wiring groove (and via hole) at the same time by the flattening treatment based on the ordinary etch-back process. However, if the metal CMP is used, the metal film in the minute wiring groove (or via hole) and the metal film having the same area as the electrode pad could be flattened at the same time to form the wiring and the metal film pattern.

Figure 5:
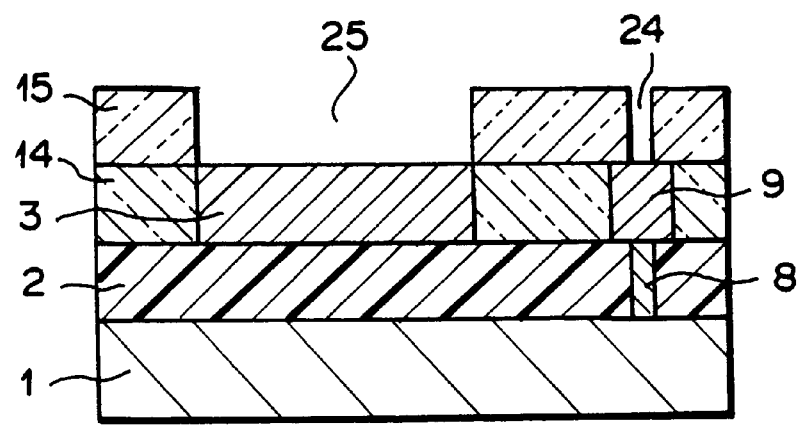
FIG. 5 is a cross-sectional view showing another manufacturing step of the first embodiment of the manufacturing method of the semiconductor device having the multilayer wiring structure according to the present invention.

Subsequently, as shown in FIG. 5, a second interlayer insulating film 15 composed of an organic insulating film is formed on the intermediate structure of FIG. 4 as in the case of the first inter layer insulating film 14, and then subjected to the patterning treatment to form a via hole 24 at the position corresponding to the first-layer wiring 9. At this time, a groove 25 having the same plan view shape as the metal film pattern 3 is formed at the position corresponding to the metal film pattern 3.

Figure 6:
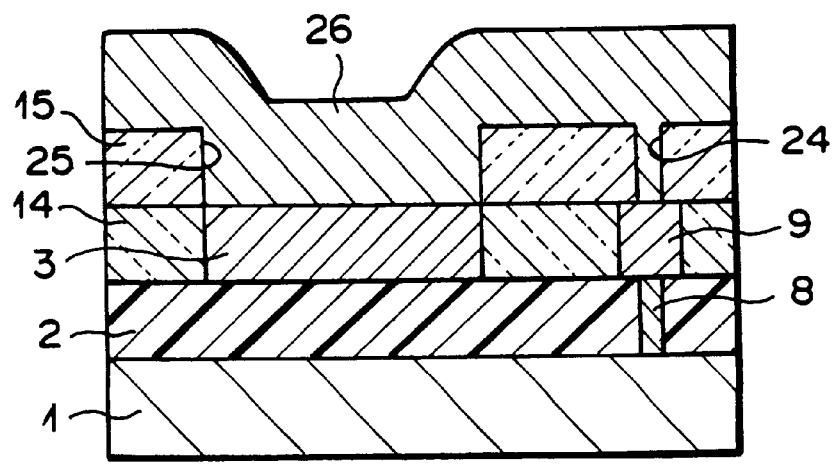
FIG. 6 is a cross-sectional view showing another manufacturing step of the first embodiment of the manufacturing method of the semiconductor device having the multilayer wiring structure according to the present invention.

Subsequently, as shown in FIG. 6, a metal film 26 is formed on the intermediate structure of FIG. 5 as in the case of the metal film 23 to fill the metal film 26 into the via hole 24 and the electrode pad forming groove 25.

Figure 7:
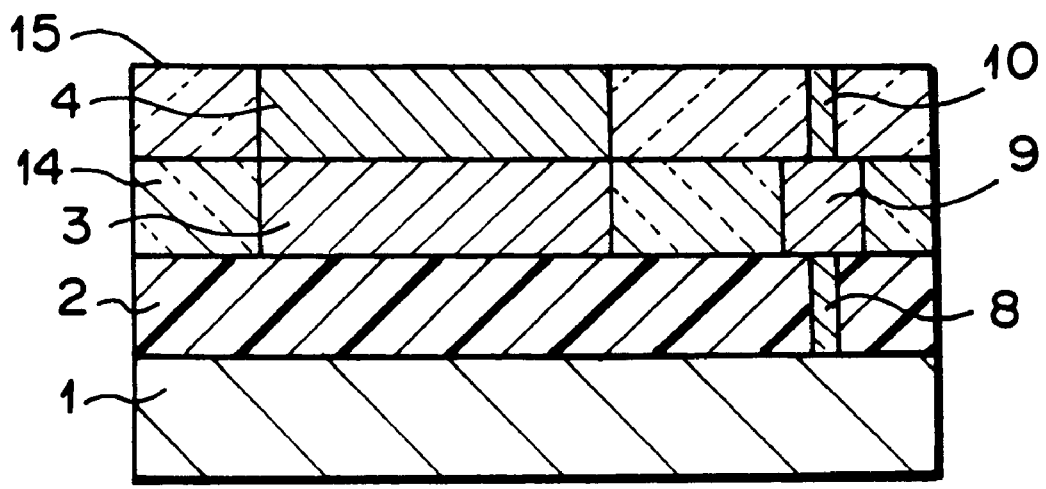
FIG. 7 is a cross-sectional view showing another manufacturing step of the first embodiment of the manufacturing method of the semiconductor device having the multilayer wiring structure according to the present invention.

Subsequently, as shown in FIG. 7, the metal film 26 is polished and flattened by using the metal CMP technique as in the case of the metal film 23 to form via metal 10 and a metal film pattern 4 composed of a part of the electrode pad.

Figure 8:
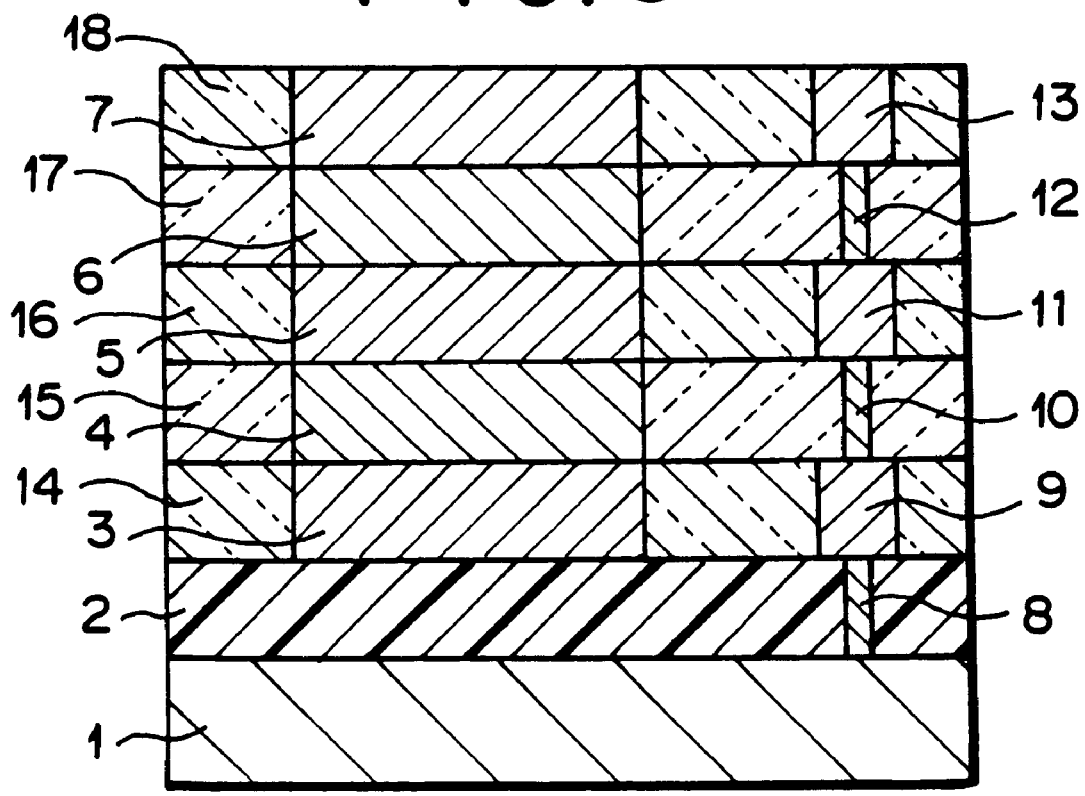
FIG. 8 is a cross-sectional view showing another manufacturing step of the first embodiment of the manufacturing method of the semiconductor device having the multilayer wiring structure according to the present invention.

By repeating the same steps as the step of forming the wiring 9 and the metal film pattern 3 in the organic interlayer insulating film 14 and the step of forming the via metal 10 and the metal film pattern 4 in the organic interlayer insulating film 15, as shown in FIG. 8, organic insulating films (third, fourth and fifth interlayer insulting films) 16, 17, 18 are formed on the organic interlayer insulating film (second interlayer insulating film) 15, a second-layer wiring 11 and a metal film pattern 5 are formed in the organic interlayer insulating film 16, via metal 12 and a metal film pattern 6 are formed in the organic interlayer insulating film 17, and a third-layer wiring 13 and a metal film pattern 7 are formed in the organic interlayer insulating film 18. The second-layer wiring 11 is electrically connected to the first-layer wiring 9 through the via metal 10, and the third-layer wiring 13 is electrically connected to the second-layer wiring 11 through the via metal 12.

Figure 9:
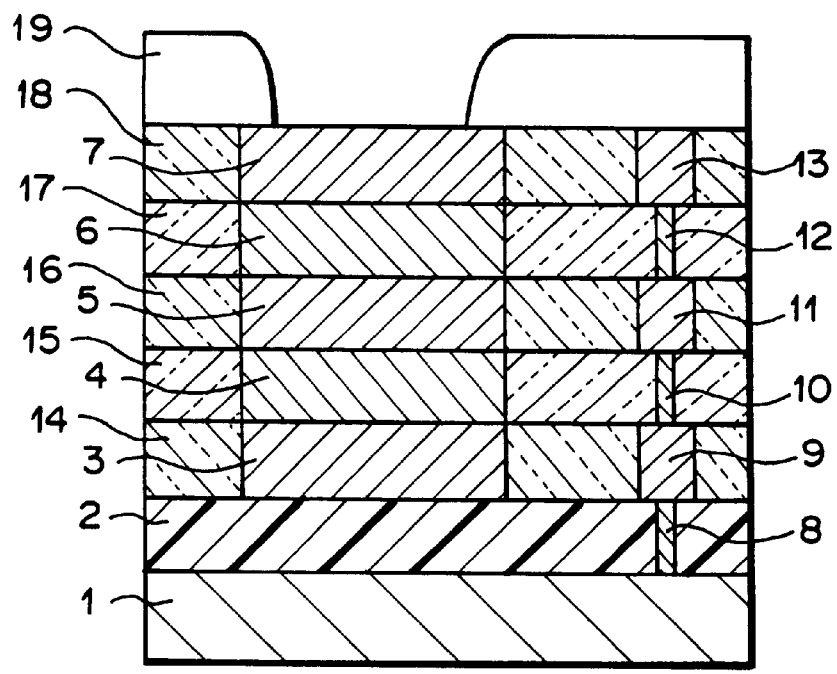
FIG. 9 is a cross-sectional view showing another manufacturing step of the first embodiment of the manufacturing method of the semiconductor device having the multilayer wiring structure according to the present invention.

Subsequently, as shown in FIG. 9, an insulating film 19 is formed on the intermediate structure of FIG. 8, and a hole which is slightly smaller in diameter than the metal film pattern 7. In the multilayer wiring structure of this embodiment thus obtained, the electrode pad is constructed by the laminate body (metal pillar) composed of the metal film patterns 3 to 7. The electrode pad is formed of the conductive member which is formed so as to penetrate through the interlayer insulting films 14 to 18 in the film thickness direction, and the side surface of the conductive member extends in the film thickness direction (in the up-and-down direction in FIG. 9).

Figure 10:
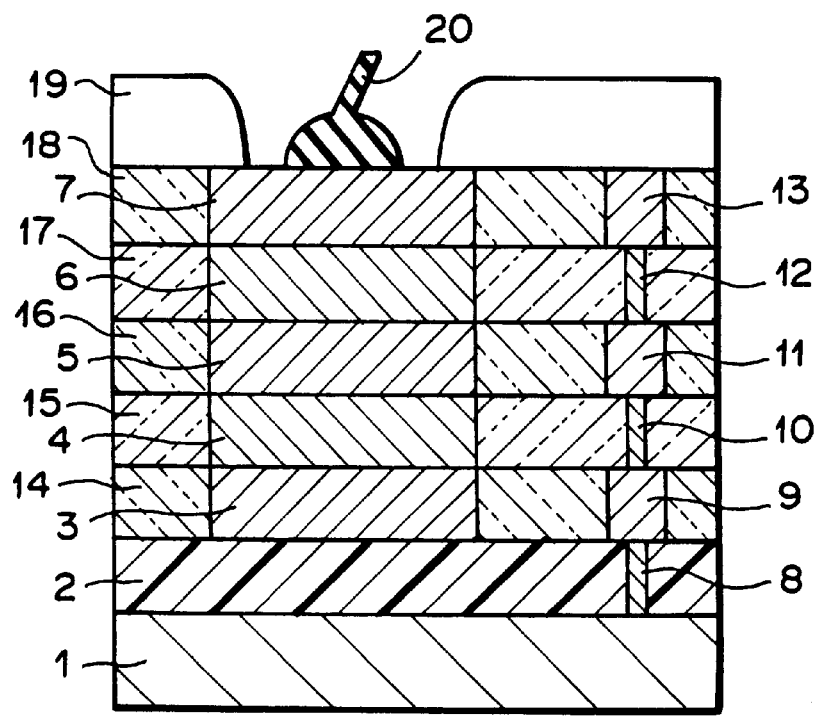
FIG. 10 is a cross-sectional view showing another manufacturing step of the first embodiment of the manufacturing method of the semiconductor device having the multilayer wiring structure according to the present invention.

Subsequently, as shown in FIG. 10, a wire 20 is bonded to the uppermost layer metal film pattern 7 of the electrode pad. In the bonding step, the impacts such as press force, tensile force, etc, which are applied to the electrode pad by the bonding head are transmitted through the laminate body of the metal film patterns 3 to 7, and then transmitted from the lowermost layer metal film pattern 3 to the lowermost inorganic insulating film 2, so that little force is directly applied to the organic interlayer insulating films 14 to 18.

Accordingly, in the multilayer wiring structure of this embodiment, since no organic interlayer insulating film exists below the electrode pad, the press force in the bonding step is applied to only the metal film pattern and the inorganic insulating film which are high in film strength and adhesiveness, and thus occurrence of cracks in the organic interlayer insulating film can be prevented. Likewise, since no organic layer insulating film exists below the electrode pad, the tensile force in the bonding step is applied to only the metal film pattern and the inorganic insulating film which are high in film strength and adhesiveness, the exfoliation of the electrode pad can be prevented.

FIGS. 11 to 17 are cross-sectional views showing a series of a manufacturing process according to a second embodiment of the method of manufacturing the semiconductor device having the multilayer wiring structure according to the present invention. In these figures, the members having the same functions as shown in FIGS. 1 to 10 are represented by the same reference numerals.

First, as shown in FIG. 11, a lowermost inorganic insulating film 2 is formed on a silicon substrate in which various functional elements such as transistors, diodes, capacitors, etc. are formed, and a first organic interlayer insulating film 14 is formed thereon. The first interlayer insulating film 14 is subjected to the patterning treatment by using the dry etching technique to form a groove 21 for first-layer wiring and an electrode pad forming groove 22. Further, a via hole 49 is formed in the lowermost inorganic insulating film 2.

Subsequently, as shown in FIG. 12, a metal film 23 is formed on the intermediate structure of FIG. 11 to fill the metal film 23 into the via hole 49, the first-layer wiring groove 21 and the electrode pad forming groove 22 at the same time.

Subsequently, as shown in FIG. 13, the metal film 23 is flattened by using the metal CMP technique, and via metal 8, a first-layer wiring 9 and a metal film pattern 3 are formed.

Subsequently, as shown in FIG. 14, a second organic interlayer insulating film 15 and a third organic interlayer insulating film 16 are formed on the intermediate structure of FIG. 13, and a via hole 24, a second-layer wiring groove 50 and an electrode pad forming groove 51 are formed in these films 15 and 16. Further, a metal film 52 is formed thereon to fill the metal film 52 into the via hole 24, the second-layer wiring groove 50 and the electrode pad forming groove 51 at the same time.

Subsequently, as shown in FIG. 15, the metal film 52 is flattened by using the metal CMP technique, and via metal 10, a second-layer wiring 11 and a metal film pattern 53 are formed.

Figure 16:
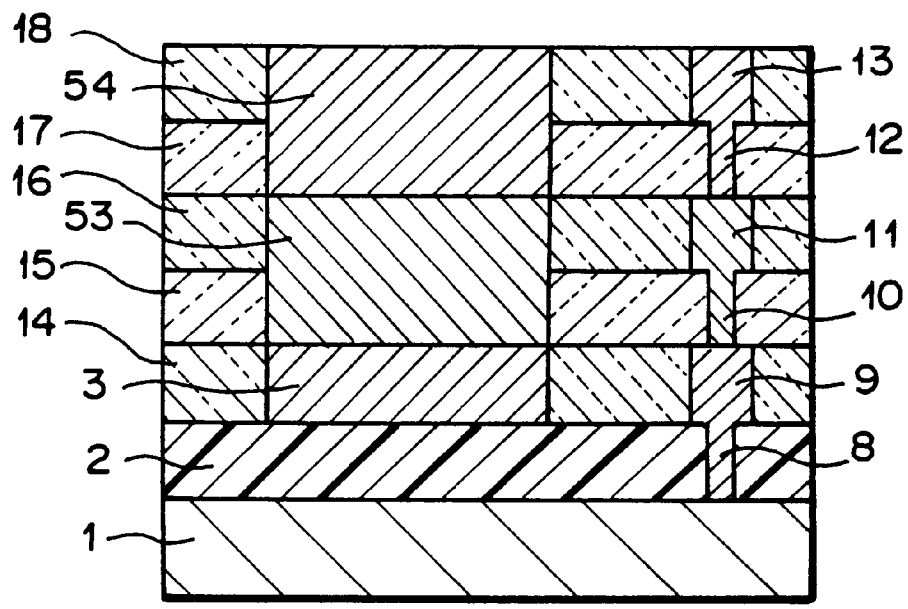
FIG. 16 is a cross-sectional view showing another manufacturing step of the second embodiment of the manufacturing method of the semiconductor device having the multilayer wiring structure according to the present invention.

Subsequently, the same steps as shown in FIGS. 14 and 15 are carried out on the intermediate structure of FIG. 15 to form a fourth organic interlayer insulating film 17 and a fifth organic interlayer insulating film 18 as shown in FIG. 16, and via metal 12, a third-layer wiring 13 and a metal film pattern 54.

Figure 17:
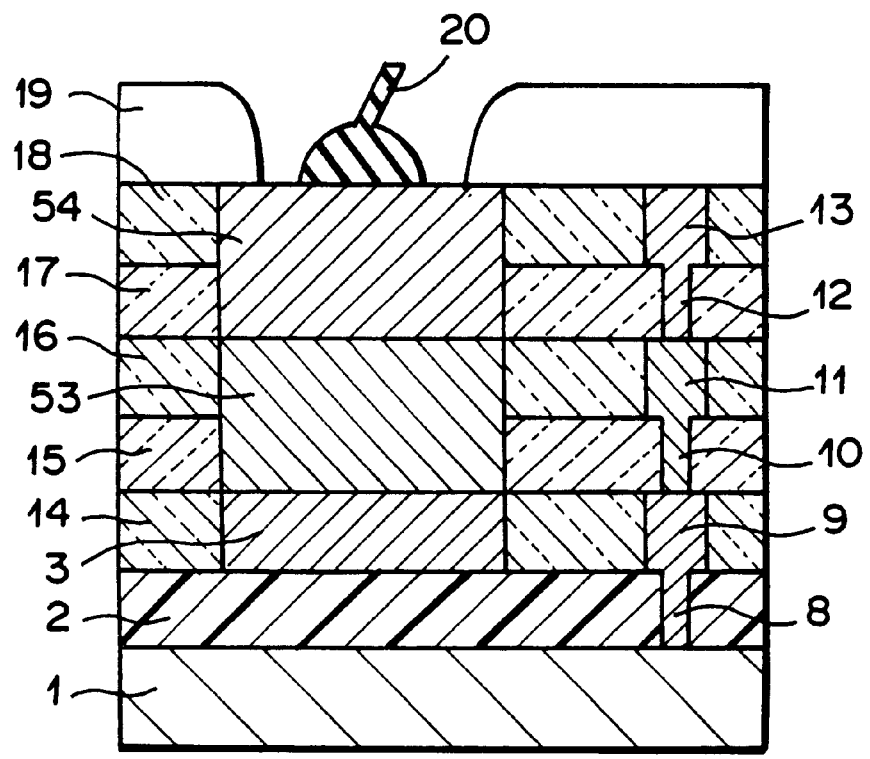
FIG. 17 is a cross-sectional view showing another manufacturing step of the second embodiment of the manufacturing method of the semiconductor device having the multilayer wiring structure according to the present invention.
Figure 22:
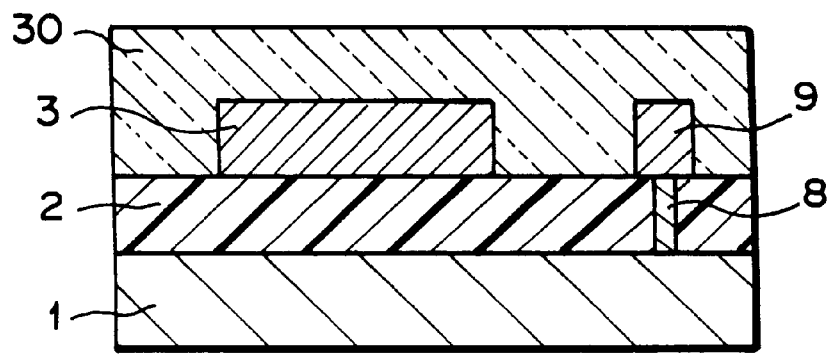
FIG. 22 is a cross-sectional view showing another manufacturing step of third embodiment of the manufacturing method of the semiconductor device having the multilayer wiring structure according to the present invention.

Subsequently, as shown in FIG. 17, an insulating film 19 is formed on the intermediate structure of FIG. 16, and then a hole which is slightly smaller than the metal film pattern 54 is formed on the insulating film.

In the multilayer wiring structure of this embodiment thus obtained, the electrode pad is constructed by the laminate body (metal pillar) composed of the metal film patterns 3, 53, 54. This electrode pad is composed of a conductive member formed so as to penetrate through the interlayer insulating films 14 to 18 in the film thickness direction, and the side surface of the conductive member extends in the film thickness direction (the up-and-down direction in FIG. 17). Further, a wire 20 is bonded to the uppermost layer metal film pattern 54 of the electrode pad.

In the multilayer wiring structure of this embodiment, the same effect as the first embodiment can be obtained. Further, the manufacturing method of this second embodiment is different from the first embodiment in that the via hole and the wiring groove are filled with the conductive material at the same time, so that the number of steps can be greatly reduced.

FIGS. 18 to 26 are cross-sectional view showing a series of manufacturing steps according to a third embodiment of the method of manufacturing a semiconductor device having a multilayer wiring structure according to the present invention. In these figures, the elements having the same functions as shown in FIGS. 1 to 17 are represented by the same reference numerals.

First, as shown in FIG. 18, a lowermost inorganic insulating film 2 is formed on a silicon substrate 1 in which various functional elements such as transistors, diodes, capacitors, etc. are formed, and via metal 8 is filled in a via hole formed in the lowermost inorganic insulating film 2.

Subsequently, as shown in FIG. 19, a metal film 23 is formed on the lowermost inorganic insulting film 2.

Thereafter, as shown in FIG. 20, the metal film 23 is subjected to the patterning treatment by using the etching technique to form a first-layer wiring 9 and an electrode pad forming metal film pattern 3.

Subsequently, as shown in FIG. 21, an organic insulating film 30' is formed at a sufficient thickness on the intermediate structure of FIG. 20.

Thereafter, the organic insulating film 30' thus obtained is flattened by using the CMP technique to form a first organic interlayer insulating film 30 (the first-layer wiring 9 and the electrode pad forming metal film pattern 3 are not exposed to the outside).

Figure 23:
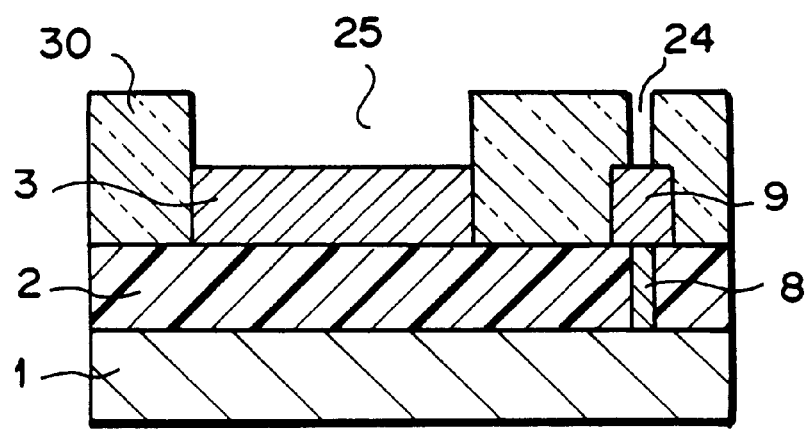
FIG. 23 is a cross-sectional view showing another manufacturing step of third embodiment of the manufacturing method of the semiconductor device having the multilayer wiring structure according to the present invention.

Subsequently, as shown in FIG. 23, a via hole 24 and an electrode pad forming groove 25 are formed in the first organic interlayer insulating film 30. The upper surface of the electrode pad forming metal film pattern 3 is perfectly exposed to the outside at the bottom of the groove 25 by the formation of the groove 25.

Figure 24:
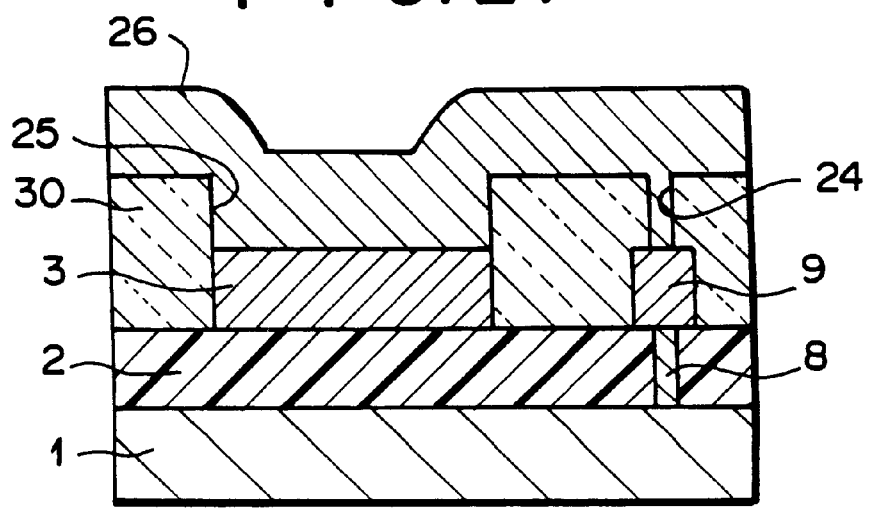
FIG. 24 is a cross-sectional view showing another manufacturing step of third embodiment of the manufacturing method of the semiconductor device having the multilayer wiring structure according to the present invention.

Subsequently, as shown in FIG. 24, a metal film 26 is formed on the intermediate structure of FIG. 23.

Figure 25:
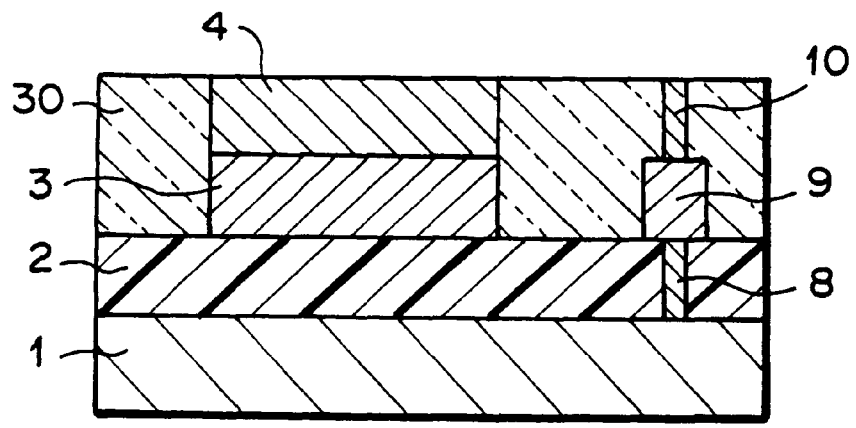
FIG. 25 is a cross-sectional view showing another manufacturing step of third embodiment of the manufacturing method of the semiconductor device having the multilayer wiring structure according to the present invention.

Then, as shown in FIG. 25, the metal film 23 is flattened by using the metal CMP technique and via metal 10 and an electrode pad forming metal film pattern 4 are formed.

Figure 26:
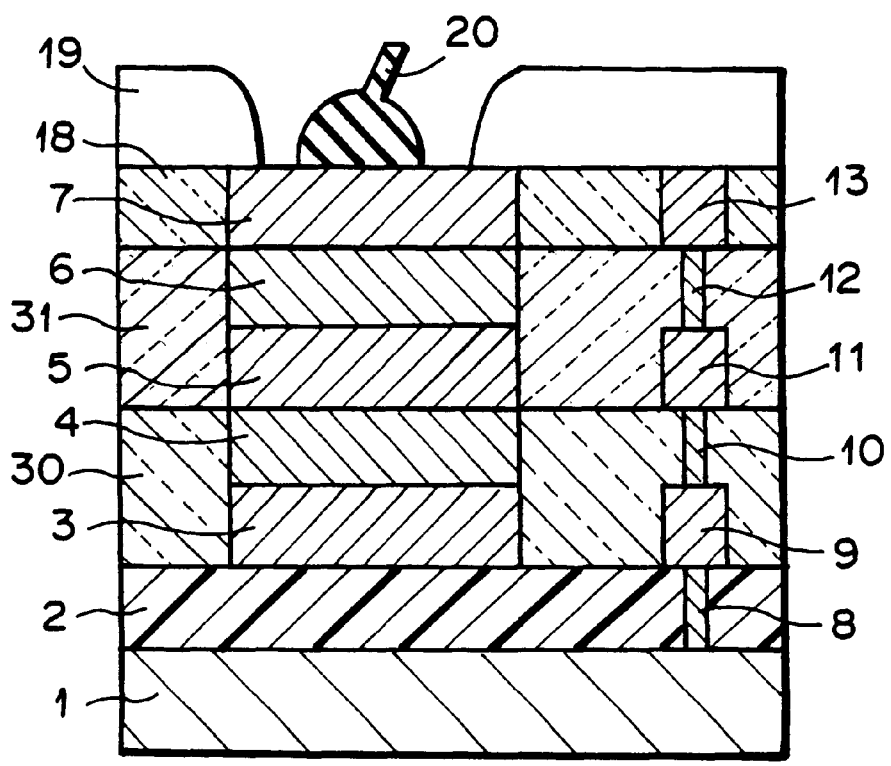
FIG. 26 is a cross-sectional view showing another manufacturing step of third embodiment of the manufacturing method of the semiconductor device having the multilayer wiring structure according to the present invention.
Figure 27:
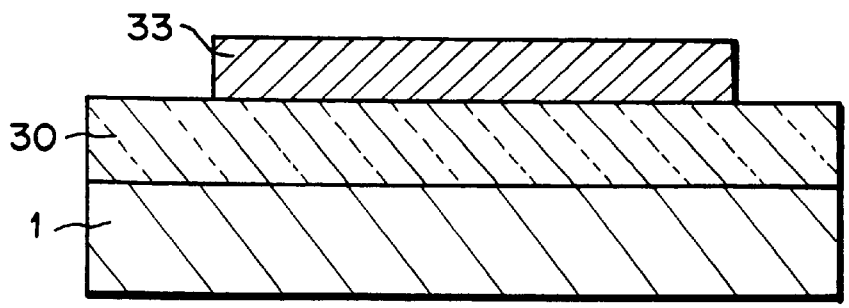
FIG. 27 is a cross-sectional view showing a manufacturing method of a conventional multilayer wiring structure.
Figure 28:
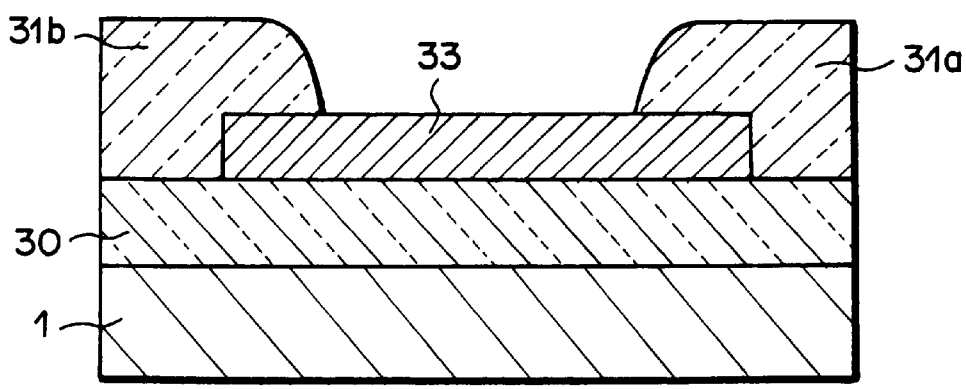
FIG. 28 is a cross-sectional view showing the manufacturing method of the conventional multilayer wiring structure.
Figure 29:
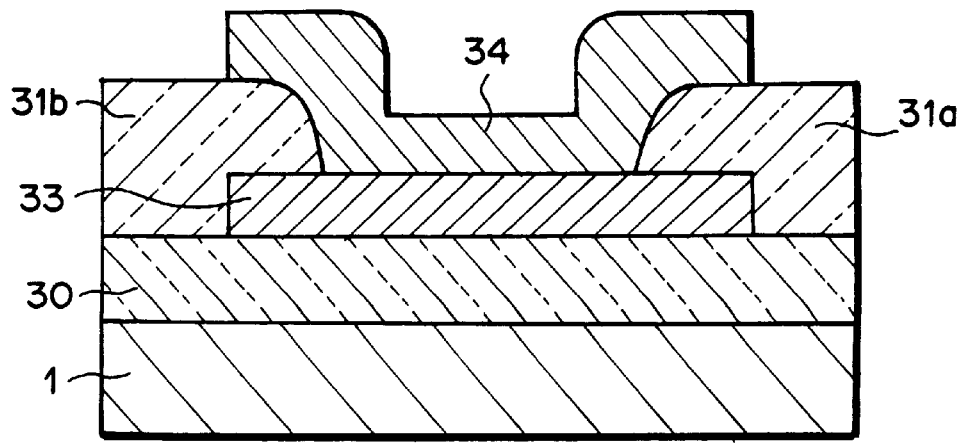
FIG. 29 is a cross-sectional view showing the manufacturing method of the conventional multilayer wiring structure.
Figure 30:
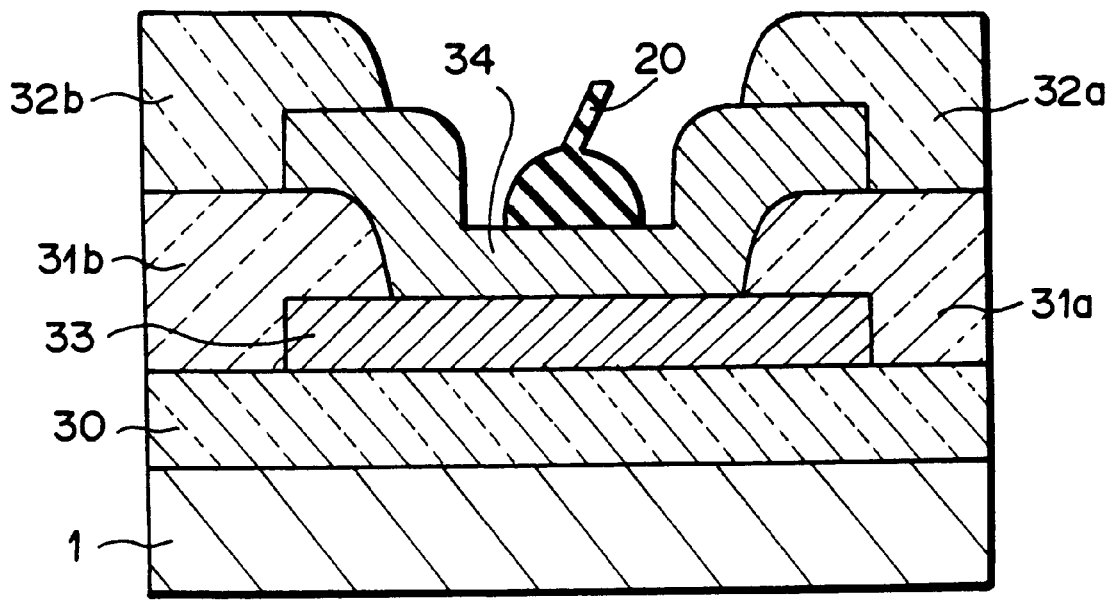
FIG. 30 is a cross-sectional view showing the manufacturing method of the conventional multilayer wiring structure.
Figure 31:
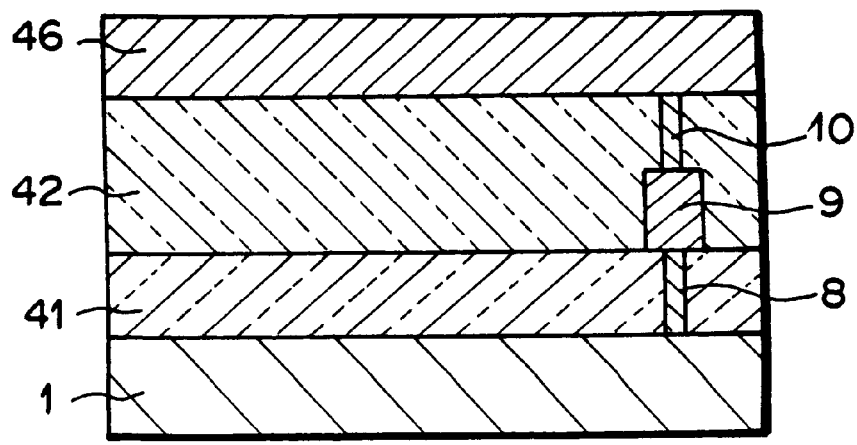
FIG. 31 is a cross-sectional view showing a manufacturing method of another conventional multilayer wiring structure.
Figure 32:
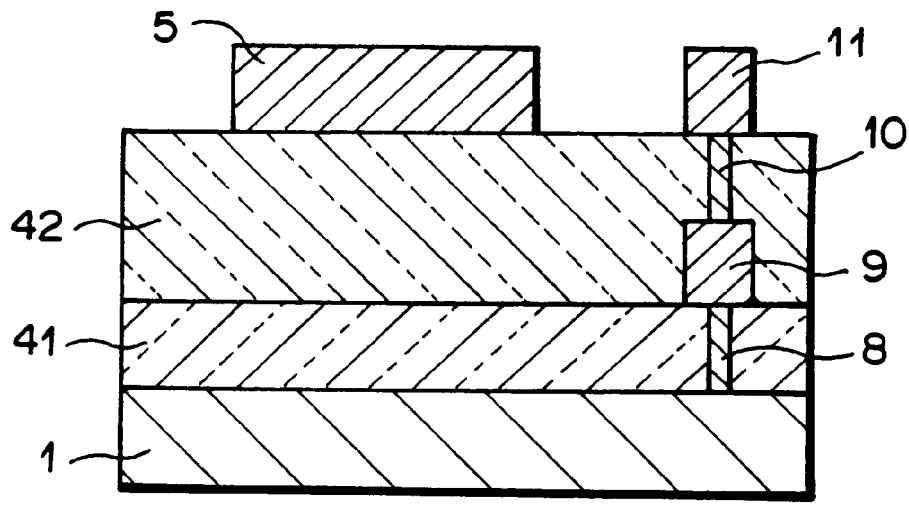
FIG. 32 is a cross-sectional view showing the manufacturing method of the conventional multilayer wiring structure.
Figure 33:
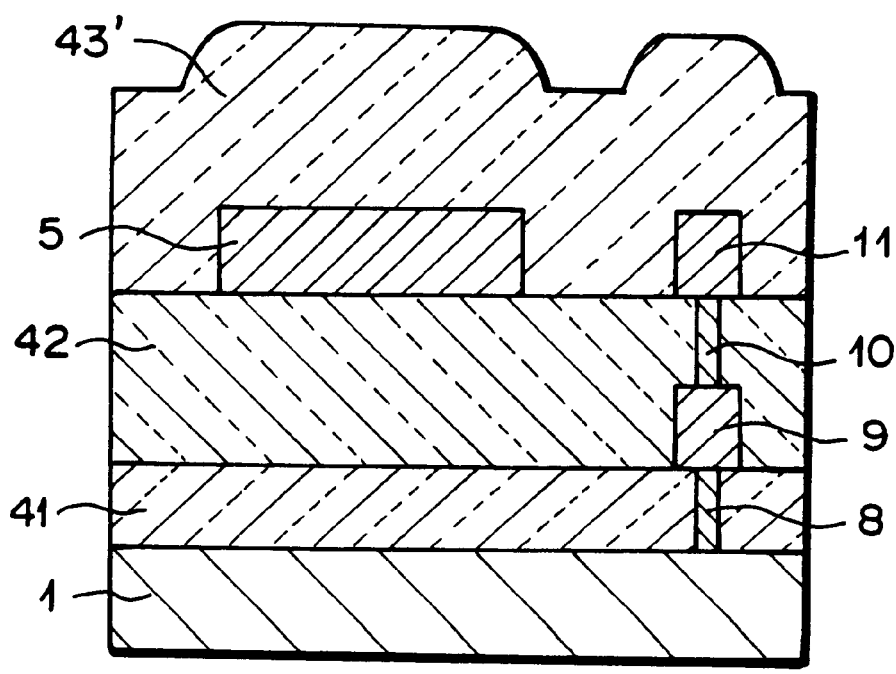
FIG. 33 is a cross-sectional view showing the manufacturing method of-the conventional multilayer wiring structure.
Figure 34:
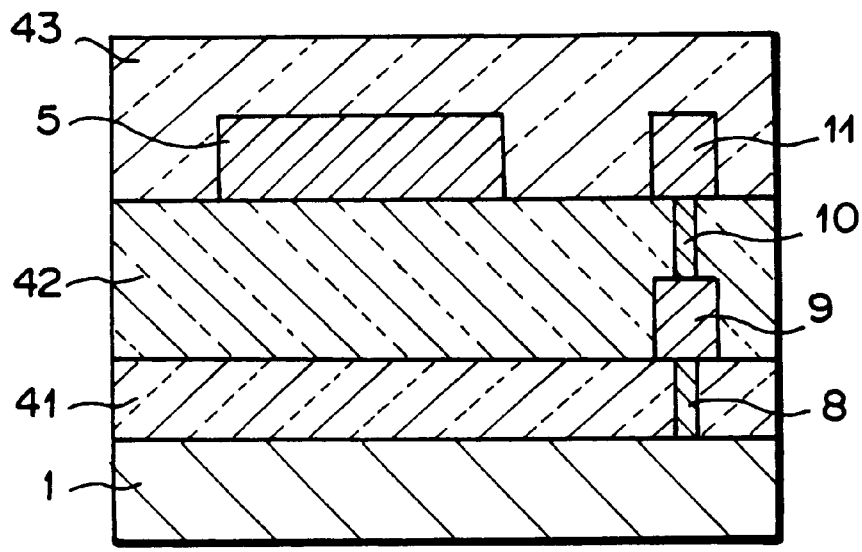
FIG. 34 is a cross-sectional view showing the manufacturing method of the conventional multilayer wiring structure.
Figure 35:
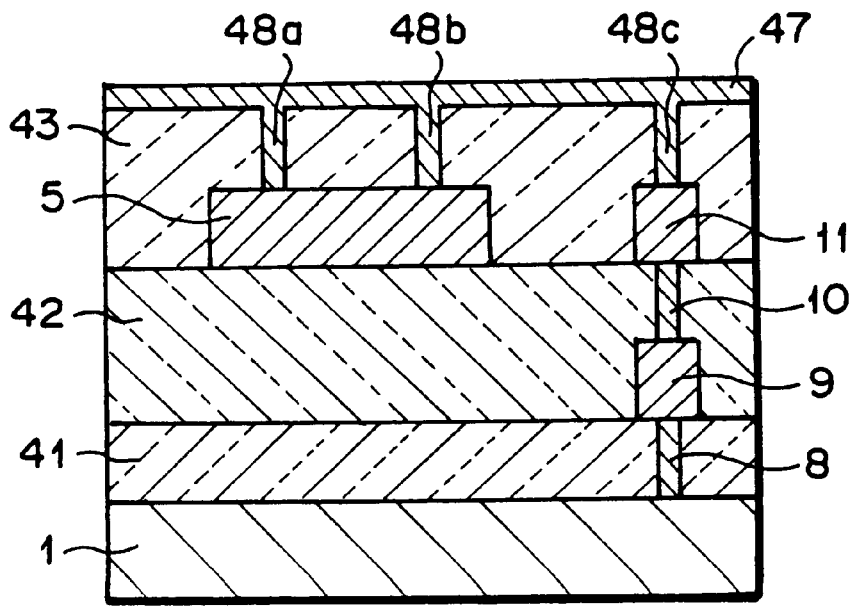
FIG. 35 is a cross-sectional view showing the manufacturing method of the conventional multilayer wiring structure.
Figure 36:
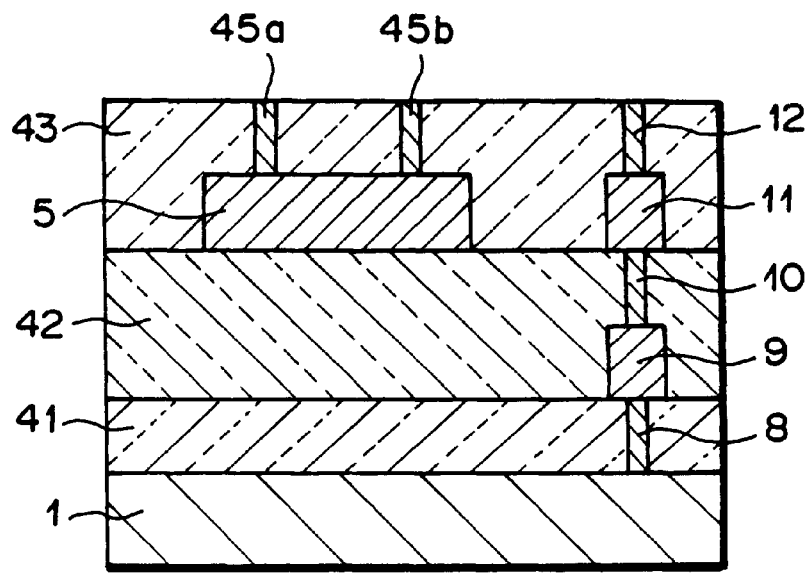
FIG. 36 is a cross-sectional view showing the manufacturing method of the conventional multilayer wiring structure.
Figure 37:
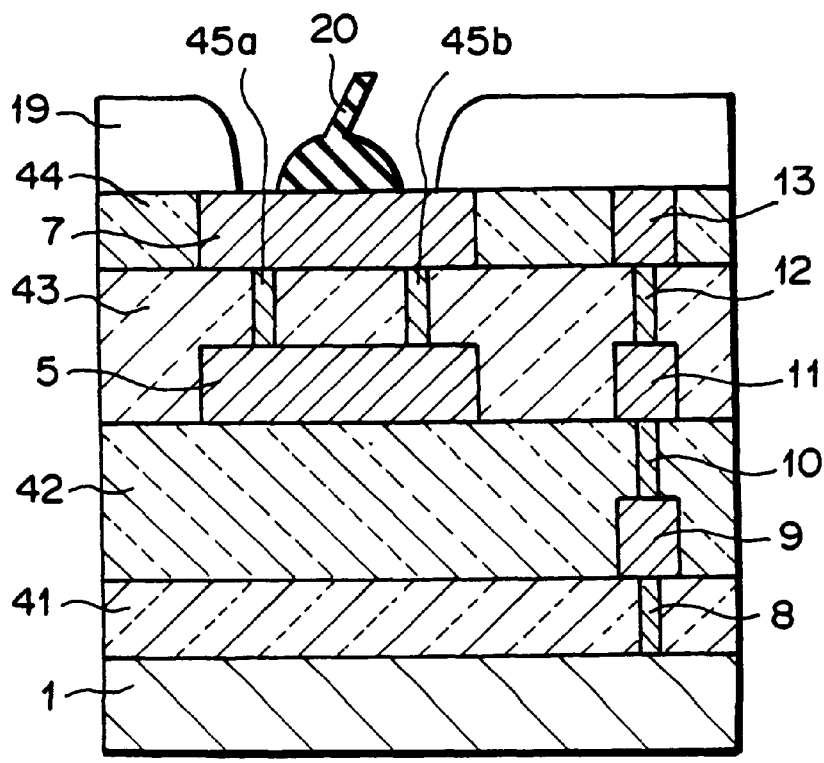
FIG. 37 is a cross-sectional view showing the manufacturing method of the conventional multilayer wiring structure.

The same steps as shown in FIGS. 19 to 25 are suitably carried out on the intermediate structure of FIG. 25 to form a second organic interlayer insulating film 31 and a third organic interlayer insulating film 18 and form via metal 12, a second-layer wiring 11, a third-layer wiring 13 and metal film patterns 5, 6, 7 in the second and third organic interlayer insulting films 31 and 18 as shown in FIG. 26. Further, an insulating film 19 is formed thereon, and a hole which is slightly smaller than the metal film pattern 7 is formed in the insulating film 19.

In the multilayer wiring structure of this embodiment thus obtained, the electrode pad is constructed by the laminate body (metal pillar) of the metal film patterns 3 to 7. The electrode pad is composed of a conductive member formed so as to penetrate through the interlayer insulating films 30, 31, 18 in the film thickness direction, and the side surface of the conductive member extends in the film thickness direction (the up-and-down direction in FIG. 26). Thereafter, a wire 20 is bonded to the uppermost layer metal film pattern 7 of the electrode pad.

According to the multilayer wiring structure of this embodiment, the same effect as the first embodiment can be obtained.

In the above-described embodiments, the three-layer wiring structure is shown. However, it is readily understood that a two-layer wiring structure or a four or more layer wiring structure can be manufactured.

What is claimed is:

1. A method of manufacturing a multilayer wiring structure including a plurality of wiring layers formed on a lowermost insulating film formed on a substrate, with an interlayer insulating film interposed between respective adjacent wiring layers of the plurality of wiring layers so as to insulate the respective adjacent wiring layers from each other and an electrode pad connected to a wiring of at least one of said plurality of wiring layers, said method comprising:

repeatedly forming one of (a) an opening having a shape corresponding to the shape of said electrode pad in the interlayer insulating film and filling conductive material into the opening to form a conductive film pattern, and (b) a conductive film pattern having the shape corresponding to the electrode pad and filling the interlayer insulating film in a portion around the conductive film pattern to form plural layers of conductive film patterns, forming said electrode pad as a laminate body of the conductive film patterns of the plural layers; and the formation of respective wiring layers is performed simultaneously with the formation of any one of said conductive film patterns of said plural layers.

2. The manufacturing method as claimed in claim 1, wherein in any one of said film forming steps (a) and (b), interlayer insulating films of two layers are formed, and the respective wiring layers are formed in any one of the two layers simultaneously with the formation of any one of said conductive film patterns.

3. The manufacturing method as claimed in claim 1, wherein in any one of said film forming steps (a) and (b), two layers of conductive film patterns are formed, and the respective wiring layers are formed simultaneously with the formation of one of said conductive film patterns.

4. The manufacturing method as claimed in claim 1, wherein when said conductive film patterns are formed, the surfaces of the conductive film patterns are flattened by using a chemical/mechanical polishing treatment.

5. The manufacturing method as claimed in claim 1, wherein when said interlayer insulating films are formed, the surfaces of said interlayer insulating films are flattened by using a chemical/mechanical polishing treatment.

6. The manufacturing method as claimed in claim 1, wherein when said opening is formed in at least one of said interlayer insulating films, a via hole is formed, and when said conductive film patterns are formed, said via hole is filled with conductive material, thereby forming a conductive path through which the wirings of the two wiring layers adjacent to the interlayer insulating film concerned are connected to each other.

7. A method of manufacturing a semiconductor device comprising a multilayer wiring structure including a plurality of wiring layers formed on a lowermost insulating film formed on a substrate, with an interlayer insulating film interposed between respective adjacent wiring layers of the plurality of wiring layers so as to insulate the respective adjacent wiring layers from each other and an electrode pad connected to a wiring of at least one of said plurality of wiring layers said method comprising:

repeatedly forming one of (a) an opening having the shape corresponding to the electrode pad in the interlayer insulating film and filling conductive material into the opening to form a conductive film pattern, and (b) a film forming step of forming a conductive film pattern having the shape corresponding to the electrode pad and filling the interlayer insulating film in a portion around the conductive film pattern to form conductive film patterns of plural layers;

forming said electrode pad as a laminate body of the conductive film patterns of the plural layers;

the formation of the respective wiring layers is performed simultaneously with the formation of any one of the conductive film patterns of the plural layers; in order to form a conductive path through which a wiring of at least one of the plurality of wiring layers and at least one of the functional elements are connected to each other, a first conductive film is formed in via holes formed in the interlayer insulating films below the wiring layer concerned simultaneously with the formation of the conductive film pattern, and a second conductive film is formed in a via hole formed in the lowermost insulating film, whereby the conductive path is formed through the first and second conductive films and the wirings of the wiring layers below the wiring layer concerned.

8. The manufacturing method as claimed in claim 7, wherein in any one of said film forming steps (a) and (b), interlayer insulating films of two layers are formed, and the respective wiring layers are formed in any one of the two layers simultaneously with the formation of any one of said conductive film patterns.

9. The manufacturing method as claimed in claim 7, wherein in any one of said film forming steps (a) and (b), two layers of conductive film patterns are formed, and the respective wiring layers are formed simultaneously with the formation of one of said conductive film patterns.

10. The manufacturing method as claimed in claim 7, wherein when the conductive film patterns are formed, the surfaces of the conductive film patterns are flattened by using a chemical/mechanical polishing treatment.

11. The manufacturing method as claimed in claim 7, wherein when the interlayer insulating films are formed, the surfaces of the interlayer insulating film s are flattened by using a chemical/mechanical polishing treatment.

* * * * *